(12) United States Patent
Zhong et al.

(10) Patent No.: US 12,096,590 B2
(45) Date of Patent: Sep. 17, 2024

(54) RAILS ASSEMBLY AND ELECTRONIC EQUIPMENT

(71) Applicant: Wistron Corporation, New Taipei (TW)

(72) Inventors: Yong-Qing Zhong, New Taipei (TW); Zhong-Hui Mao, New Taipei (TW); Zhao-Ping Fu, New Taipei (TW); Chih Yao Chou, New Taipei (TW)

(73) Assignee: Wistron Corporation, New Taipei (TW)

( * ) Notice: Subject to any disclaimer, the term of this patent is extended or adjusted under 35 U.S.C. 154(b) by 80 days.

(21) Appl. No.: 18/083,578

(22) Filed: Dec. 19, 2022

(65) Prior Publication Data

US 2024/0138091 A1  Apr. 25, 2024
US 2024/0237258 A9  Jul. 11, 2024

(30) Foreign Application Priority Data

Oct. 19, 2022 (CN) .......................... 202211281049.X

(51) Int. Cl.
*H05K 7/14* (2006.01)
*H05K 7/18* (2006.01)

(52) U.S. Cl.
CPC ......... *H05K 7/1489* (2013.01); *H05K 7/1411* (2013.01); *H05K 7/183* (2013.01)

(58) Field of Classification Search
CPC ...................................................... H05K 7/00
See application file for complete search history.

(56) References Cited

U.S. PATENT DOCUMENTS 6,209,979 B1 * 4/2001 Fall ...................... H05K 7/1489
312/319.1

FOREIGN PATENT DOCUMENTS

| CN | 111831083 | | 10/2020 | |
| CN | 111831083 A | * | 10/2020 | ............. G06F 1/187 |
| TW | 202027589 A | * | 7/2020 | |

OTHER PUBLICATIONS

"Office Action of Taiwan Counterpart Application", issued on May 18, 2023, p. 1-p. 7.

* cited by examiner

*Primary Examiner* — Jerry Wu
(74) *Attorney, Agent, or Firm* — JCIPRNET

(57) ABSTRACT

A rails assembly includes outer and inner rails, an elastic assembly, a hook member. The outer and inner rails are provided with first and second opening portions. The inner rail is disposed on the outer rail. The elastic assembly is disposed on the inner rail. The hook member is connected to the inner rail and opposite to the second opening portion. When the hook member is located at a first position by sliding the inner rail relative to the outer rail, the hook member is pushed by the elastic assembly to pass through the second opening portion. When the hook member is located at a second position in the same manner, the second and first opening portions are opposite to each other and the hook member is pushed by the elastic assembly to pass through the second and first opening portions. An electronic equipment including the rails assembly is provided.

14 Claims, 22 Drawing Sheets

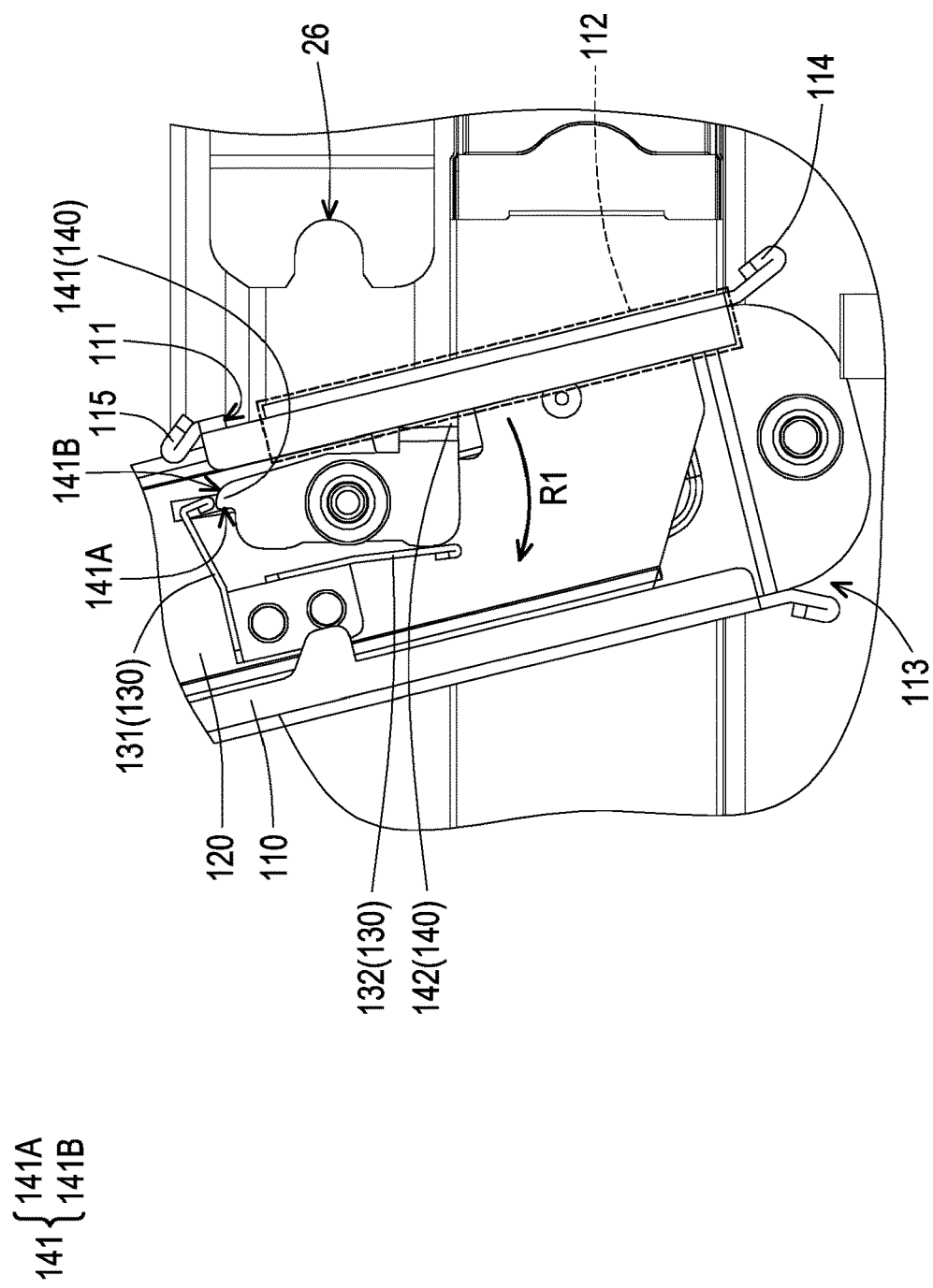

RAILS ASSEMBLY AND ELECTRONIC EQUIPMENT

CROSS-REFERENCE TO RELATED APPLICATION

This application claims the priority benefit of China application serial no. 202211281049.X filed on Oct. 19, 2022. The entirety of the above-mentioned patent application is hereby incorporated by reference herein and made a part of this specification.

BACKGROUND OF THE INVENTION

Field of the Invention

The invention relates to a link assembly and an electronic equipment including the link assembly, and more particularly, to a rails assembly and an electronic equipment including the rails assembly.

Description of Related Art

In the current servers on the market, the hard disk carrying mechanism for mounting the hard disk generally has the functions of hot plugging and quick disassembly and replacement, and such hard disk carrying mechanism is provided with a handle for the user to disassemble and mount. However, the appearance of the hard disk carrying mechanism is affected by the design of the handle, and the process for the user to remove or mount the hard disk on the hard disk carrying mechanism via the handle is too complicated. Therefore, how to design a handle-less and easy-to-operate hard disk carrying mechanism is an important research direction in the art.

SUMMARY OF THE INVENTION

The invention provides a rails assembly and an electronic equipment having a pleasing appearance and easy-to-operate hard disk disassembly and mounting process.

An electronic equipment of the invention includes a casing, a frame, and a rails assembly. A frame body is detachably mounted on the casing. The rails assembly includes an outer rail and an inner rail, the outer rail is pivotally connected to the casing, and the inner rail is pivotally connected to the frame body and slidably disposed on the outer rail. The frame body is selectively folded in the casing by sliding the inner rail relative to the outer rail to make the inner rail pivot relative to the frame body and the outer rail pivot relative to the casing.

In an embodiment of the invention, the electronic equipment includes a positioning assembly, when the frame body is folded in the casing, the frame body is positioned by the positioning assembly.

In an embodiment of the invention, the positioning assembly includes a first link member and a positioning pin, the first link member is movably disposed on the casing and provided with a positioning groove, the positioning pin is disposed on the frame body, and the positioning pin is accommodated in the positioning groove to position the frame body.

In an embodiment of the invention, the positioning assembly includes a protruding column, a second link member, and a chute, the protruding column is disposed on the first link member, the chute is obliquely disposed on the second link member, and the protruding column is driven to be slid along the chute by the second link member, and the first link member is driven to be separated from the positioning pin.

In an embodiment of the invention, the electronic equipment includes an elastic member, wherein the elastic member is disposed between the frame body and the casing, and the frame body is unfolded via an elastic force of the elastic member selectively.

In an embodiment, the frame body is provided with a pivot portion, the casing is provided with a pivot hole, the pivot portion is detachably pivoted to the pivot hole, and the frame body is pivoted with the pivot portion as an axis to be unfolded or folded in the casing selectively.

In an embodiment of the invention, the outer rail is provided with a first opening portion, the inner rail is provided with a second opening portion, the rails assembly comprises an elastic assembly and a hook member, the elastic assembly is disposed on the inner rail, and the hook member is pivotally connected to the inner rail and opposite to the second opening portion.

In an embodiment of the invention, when the frame body is folded in the casing, the hook member is pushed by the elastic assembly to pass through the second opening portion; when the frame body is unfolded on the casing, the second opening portion is opposite to the first opening portion and the hook member is pushed by the elastic assembly to pass through the second opening portion and the first opening portion.

In an embodiment of the invention, the elastic assembly includes a first elastic portion and a second elastic portion, the casing includes an abutting member, when the first elastic portion is pushed by the abutting member to be separated from the hook member to prevent the hook member from passing through the second opening portion, the hook member is pushed by the second elastic portion to pass through the second opening portion.

A rails assembly of the invention includes an outer rail, an inner rail, an elastic assembly, and a hook member. The outer rail is provided with a first opening portion, and the inner rail is provided with a second opening portion and is slidably disposed on the outer rail. The elastic assembly is disposed on the inner rail, and the hook member is pivotally connected to the inner rail and opposite to the second opening portion. When the hook member is located at a first position by sliding the inner rail relative to the outer rail, the hook member is pushed by the elastic assembly to pass through the second opening portion. When the hook member is located at a second position by sliding the inner rail relative to the outer rail, the second opening portion is opposite to the first opening portion and the hook member is pushed by the elastic assembly to pass through the second opening portion and the first opening portion.

In an embodiment of the invention, the elastic assembly includes a first elastic portion and a second elastic portion, when the first elastic portion releases the hook member, the hook member is pushed by the second elastic portion to pass through the second opening portion.

In an embodiment of the invention, an end of the outer rail is provided with a guide slope, and the hook member is guided by the guide slope to enter the outer rail.

In an embodiment of the invention, the outer rail is provided with a restraining section, the restraining section is located between the guide slope and the first opening portion, and when the inner rail is slid relative to the outer rail, the hook member is restrained in the outer rail by the restraining section.

In an embodiment of the invention, the hook member is provided with a first hook portion and a second hook portion, when the first elastic portion releases the first hook portion, the second hook portion passes through the second opening portion via an elastic force of the second elastic portion.

In an embodiment of the invention, the outer rail is provided with a guide portion, the first opening portion is located between the restraining section and the guide portion, when the hook member guided by the guide portion, the hook portion is stopped by the first elastic portion, and prevented from passing through the second opening portion.

In an embodiment of the invention, the outer rail is provided with a restraining section and a guide portion, the restraining section is located between an end of the outer rail and the first opening portion, the first opening portion is located between the restraining section and the guide portion, the hook member is restrained in the outer rail by the restraining section with a first rotating direction, the hook member is guided by the guide portion and stopped by the first elastic portion with a second rotating direction, and the second rotating direction is greater than the first rotating direction.

Based on the above, in the rails assembly and the electronic equipment of the invention, the inner rail and the outer rail are pivotally connected to the frame body and the casing, respectively, and the inner rail is slidably disposed on the outer rail. Thereby, the inner rail and the outer rail have sufficient freedom of movement to drive the frame body to be operated in different states relative to the casing. Moreover, the inner rail and the outer rail of the invention are respectively provided with the second opening portion and the first opening portion for the hook member to pass through, so that the hook member may be smoothly moved between different positions corresponding to the different states and be positioned smoothly as the inner rail is slid relative to the outer rail. Accordingly, compared with the electronic equipment of the prior art for which the frame body needs to be positioned in different states by operating the handle, the electronic equipment of the invention may achieve this object without a handle via the above configuration with simple operation, so that the hard disk on the frame body may be readily disassembled and replaced, and the overall device is more aesthetically pleasing.

BRIEF DESCRIPTION OF THE DRAWINGS

FIG. 4B is a partial enlarged view of the hook member of FIG. 4A.

DESCRIPTION OF THE EMBODIMENTS

Figure 1A:
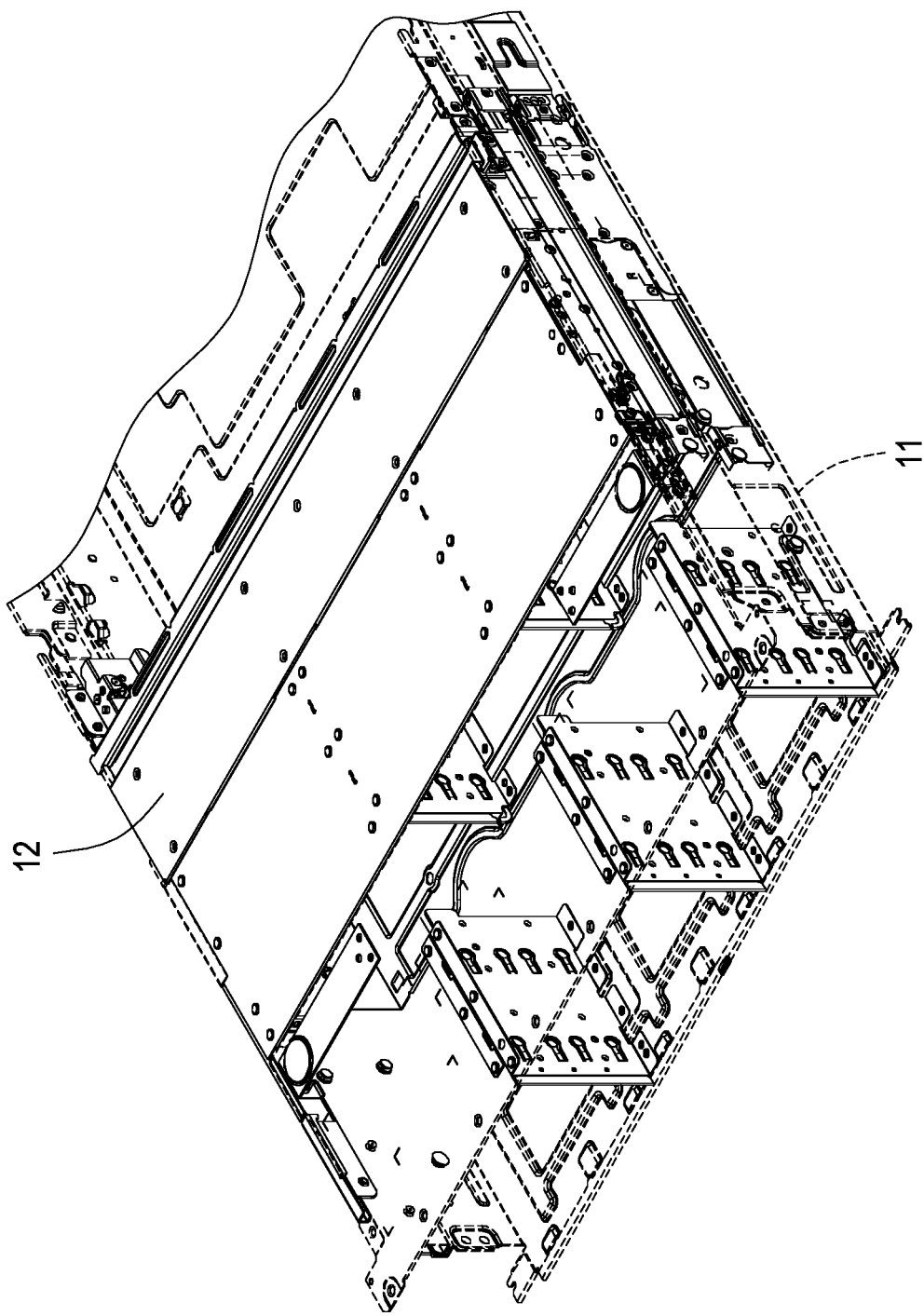
FIG. 1A and FIG. 1B are three-dimensional views of an electronic equipment in a first state and a second state, respectively, of an embodiment of the invention.
Figure 1B:
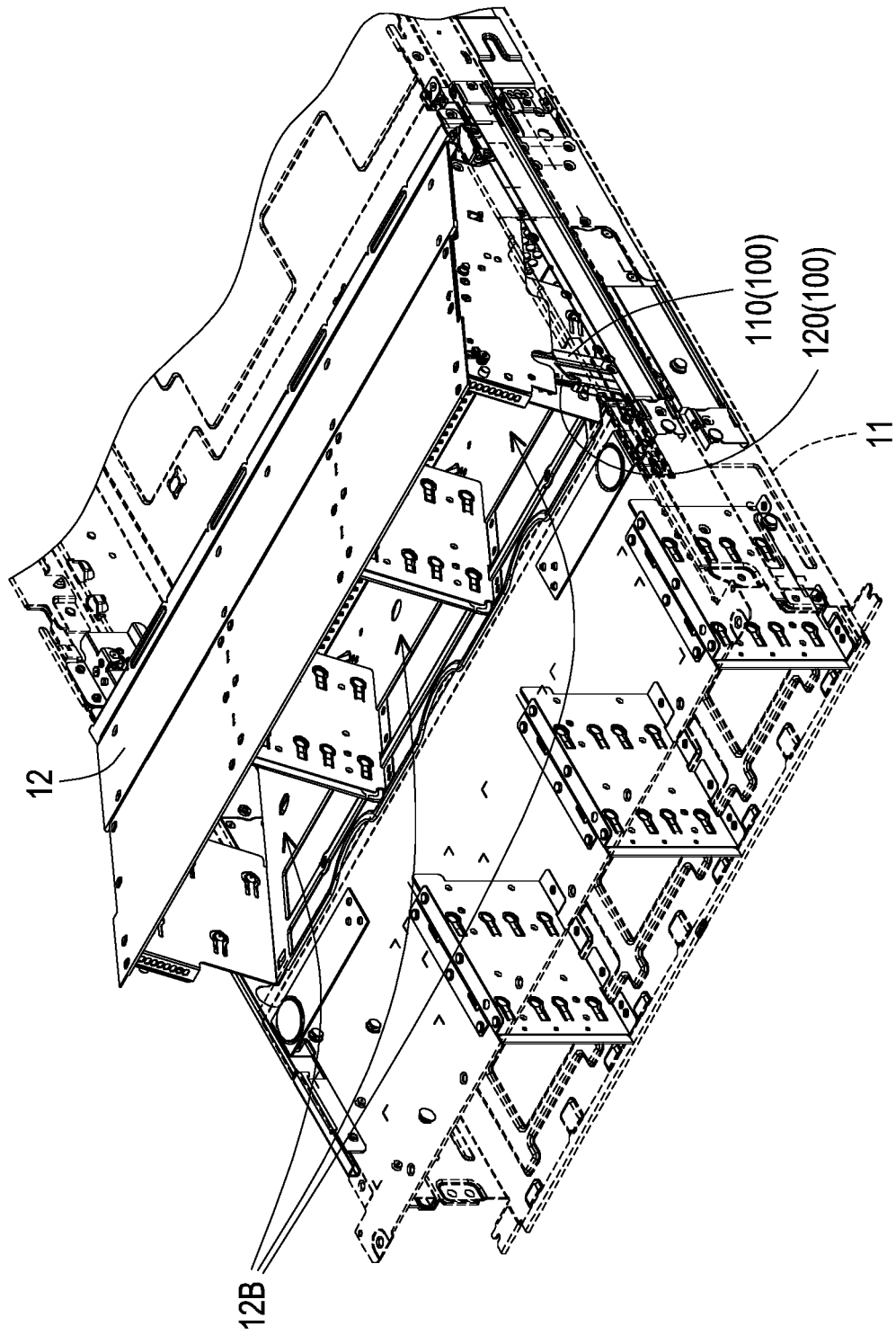
Figure 2A:
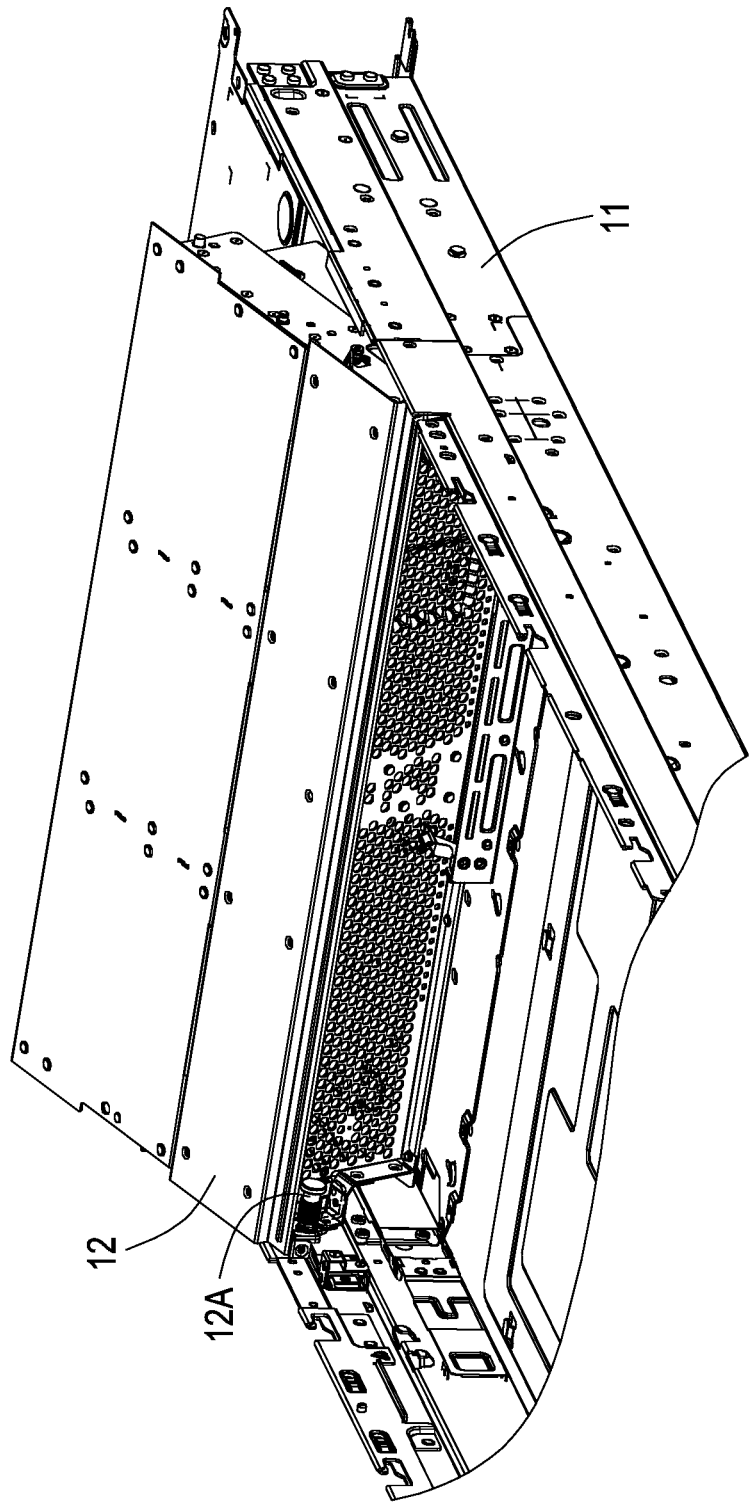
FIG. 2A is a three-dimensional view of the electronic equipment of FIG. 1B from another viewing angle.
Figure 2B:
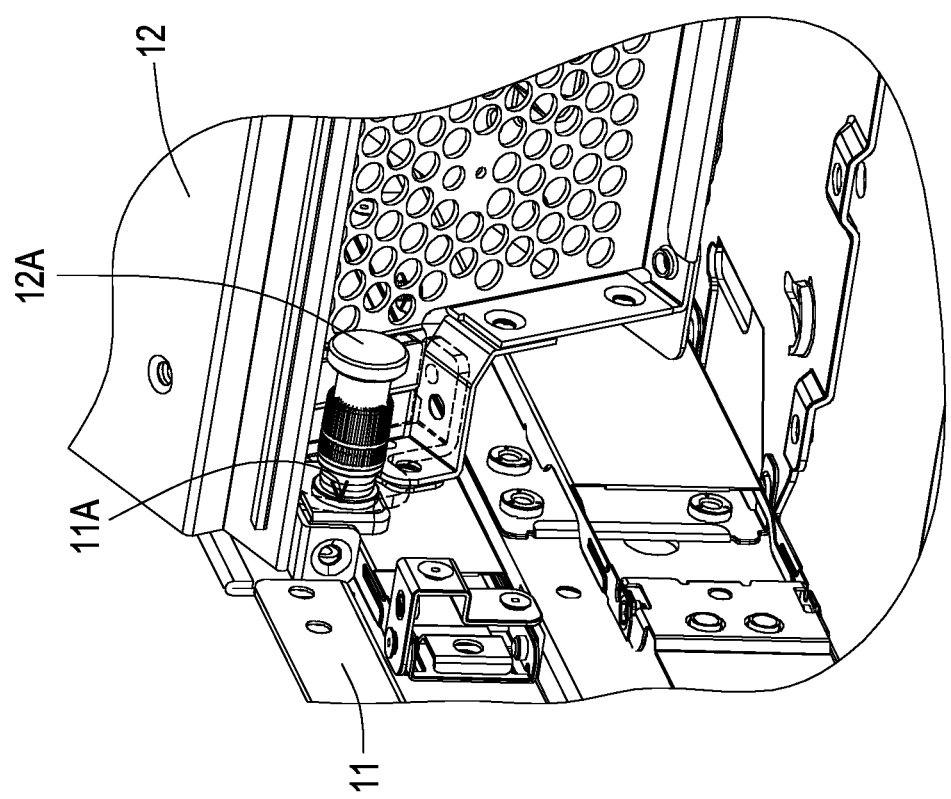
FIG. 2B is a partial enlarged view of the electronic equipment of FIG. 2A.

FIG. 1A and FIG. 1B are three-dimensional views of an electronic equipment in a first state and a second state, respectively, of an embodiment of the invention. FIG. 2A is a three-dimensional view of the electronic equipment of FIG. 1B from another viewing angle. FIG. 2B is a partial enlarged view of the electronic equipment of FIG. 2A. It should be noted that some members of FIG. 1A to FIG. 2B are drawn in perspective for the object of clarity and ease of illustration.

Please refer to FIG. 1A to FIG. 2B, an electronic equipment 10 of the present embodiment includes a casing 11, a frame body 12, and a rails assembly 100. The casing 11 is provided with a pivot hole 11A (FIG. 2B), and the frame body 12 is provided with a pivot portion 12A (FIG. 2A, FIG. 2B). The frame body 12 is detachably pivoted via the pivot portion 12A and mounted in the pivot hole 11A of the casing 11. The rails assembly 100 includes an outer rail 110 and an inner rail 120, wherein the outer rail 110 is pivotally connected to the casing 11, and the inner rail 120 is pivotally connected to the frame body 12 and slidably disposed on the outer rail 110. The frame body 12 is used to be pivoted relative to the casing 11 and positioned in a first state S1 or a second state S2 with the pivot portion 12A as the axis and by sliding the inner rail 120 relative to the outer rail 110 to make the inner rail 120 pivot relative to the frame body 12 and the outer rail 110 pivot relative to the casing 11. The pivot portion 12A of the present embodiment is a knob positioning column, but the invention does not limit the type of the pivot portion 12A.

In the present embodiment, when the frame body 12 is positioned in the first state S1, the frame body 12 is folded in the casing 11 as shown in FIG. 1A. When the frame body 12 is positioned in the second state S2, the frame body 12 is unfolded on the casing 11 as shown in FIG. 1B, and when the frame body 12 is positioned in the second state S2, the user may disassemble or mount the hard disk (not shown) in a receiving slot 12B of the frame body 12 (FIG. 1B).

Figure 3A:
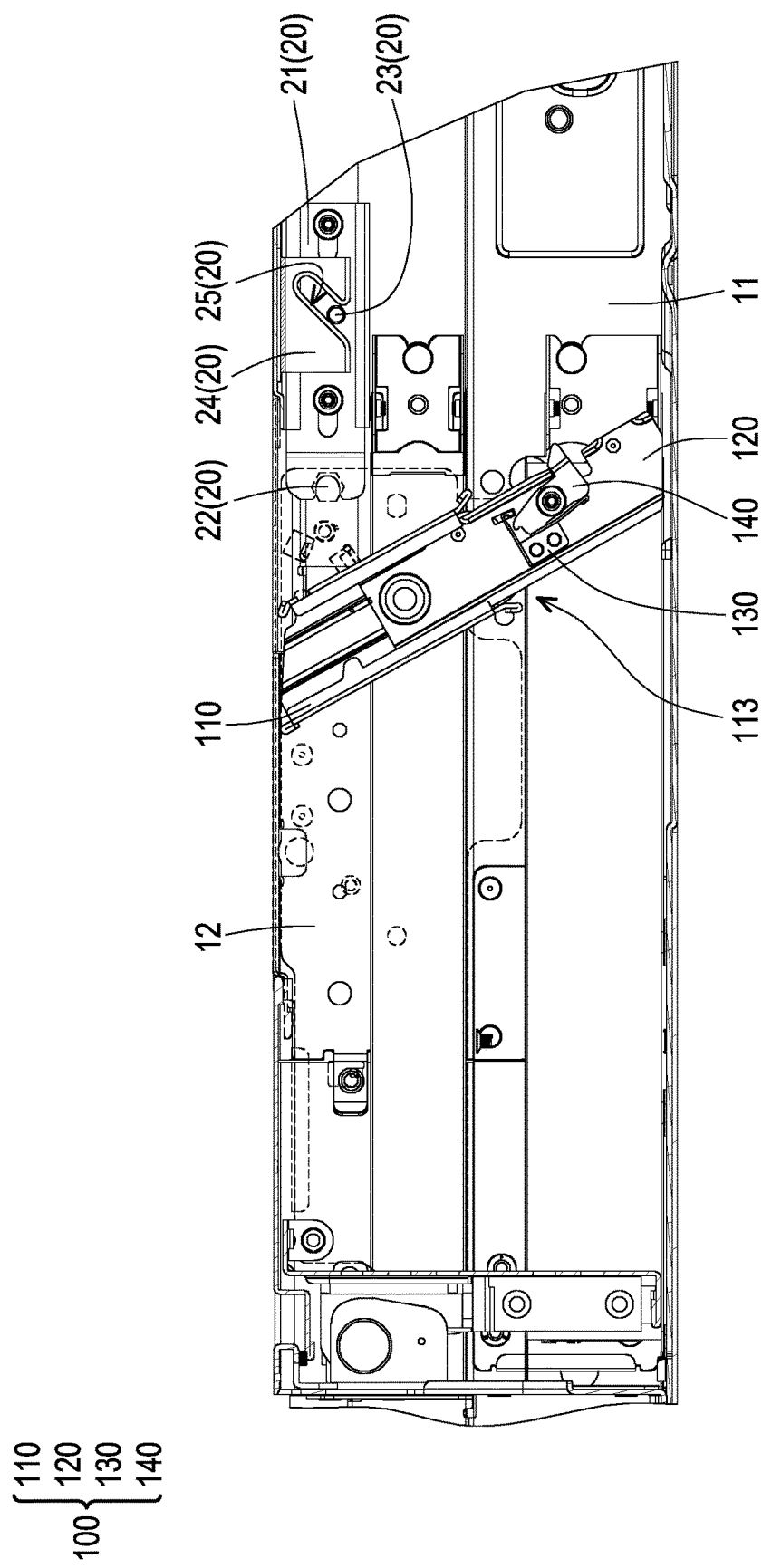
FIG. 3A is a side view of some members of the electronic equipment of FIG. 1A.
Figure 3B:
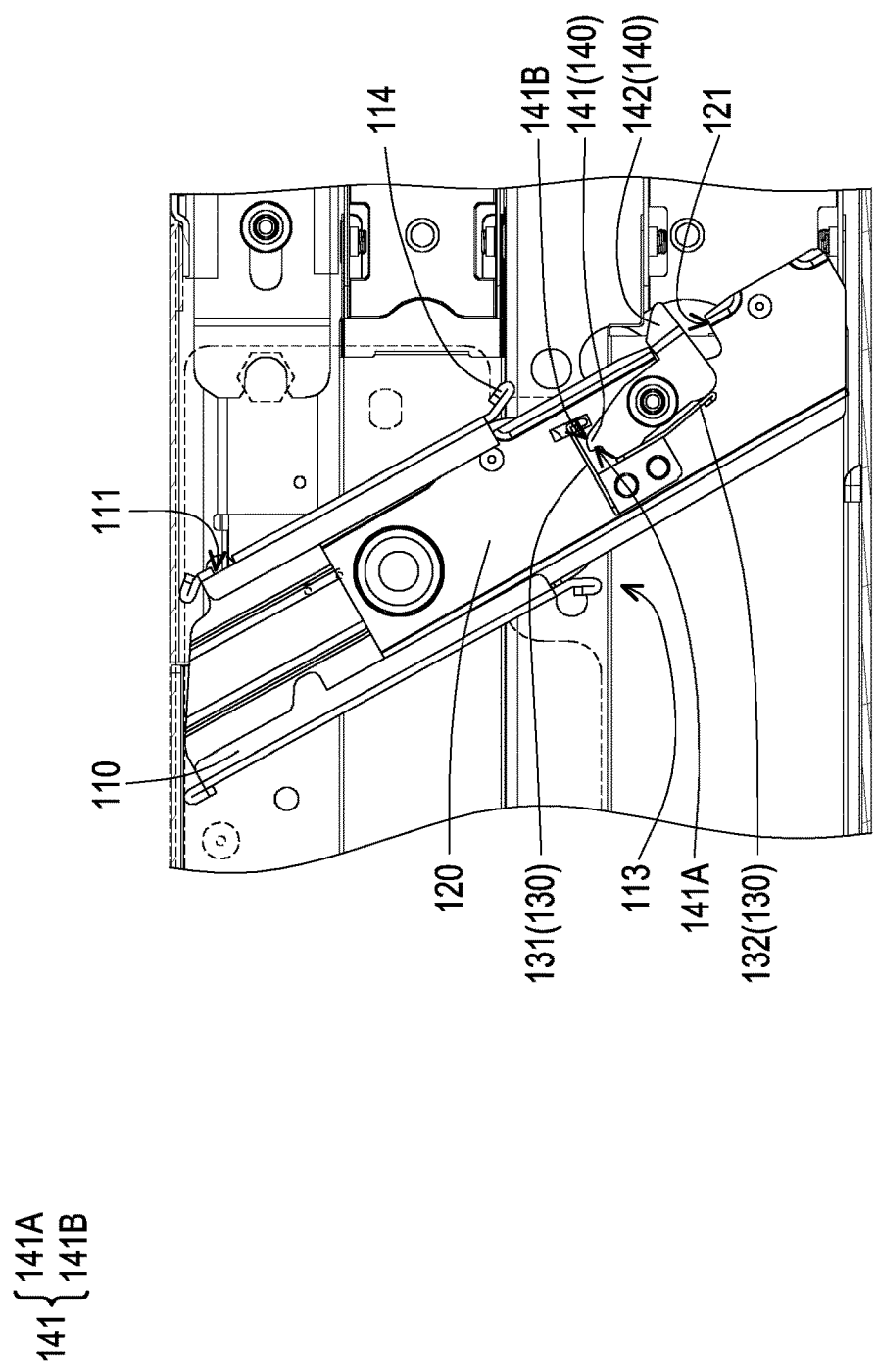
FIG. 3B is a partial enlarged view of the hook member of FIG. 3A.

FIG. 3A is a side view of some members of the electronic equipment of FIG. 1A. FIG. 3B is a partial enlarged view of the hook member of FIG. 3A. Please refer to FIG. 3A and FIG. 3B, in detail, the rails assembly 100 of the present embodiment further includes an elastic assembly 130 and a hook member 140, and the outer rail 110 and the inner rail 120 are respectively provided with a first opening portion 111 (FIG. 3B) and a second opening portion 121 (FIG. 3B).

The elastic assembly 130 is disposed on the inner rail 120, and the elastic assembly 130 includes a first elastic portion 131 (FIG. 3B) and a second elastic portion 132 (FIG. 3B). The hook member 140 is pivotally connected to the inner rail 120 and opposite to the second opening portion 121, the hook member 140 is provided with a first hook portion 141 (FIG. 3B) and a second hook portion 142 (FIG. 3B), and the first hook portion 141 includes a first side edge 141A (FIG. 3B) and a second side edge 141B (FIG. 3B).

When the hook member 140 is located at a first position P1 as shown in FIG. 3B by sliding the inner rail 120 relative to the outer rail 110, the hook member 140 is pushed by the second elastic portion 132 of the elastic assembly 130 so that the second hook portion 142 passes through the second opening portion 121. When the inner rail 120 is slid relative to the outer rail 110 so that the hook member 140 is located at the first position P1, the frame body 12 is also in the first state S1 as shown in FIG. 1A due to pivoting relative to the casing 11 at the same time.

Figure 4A:
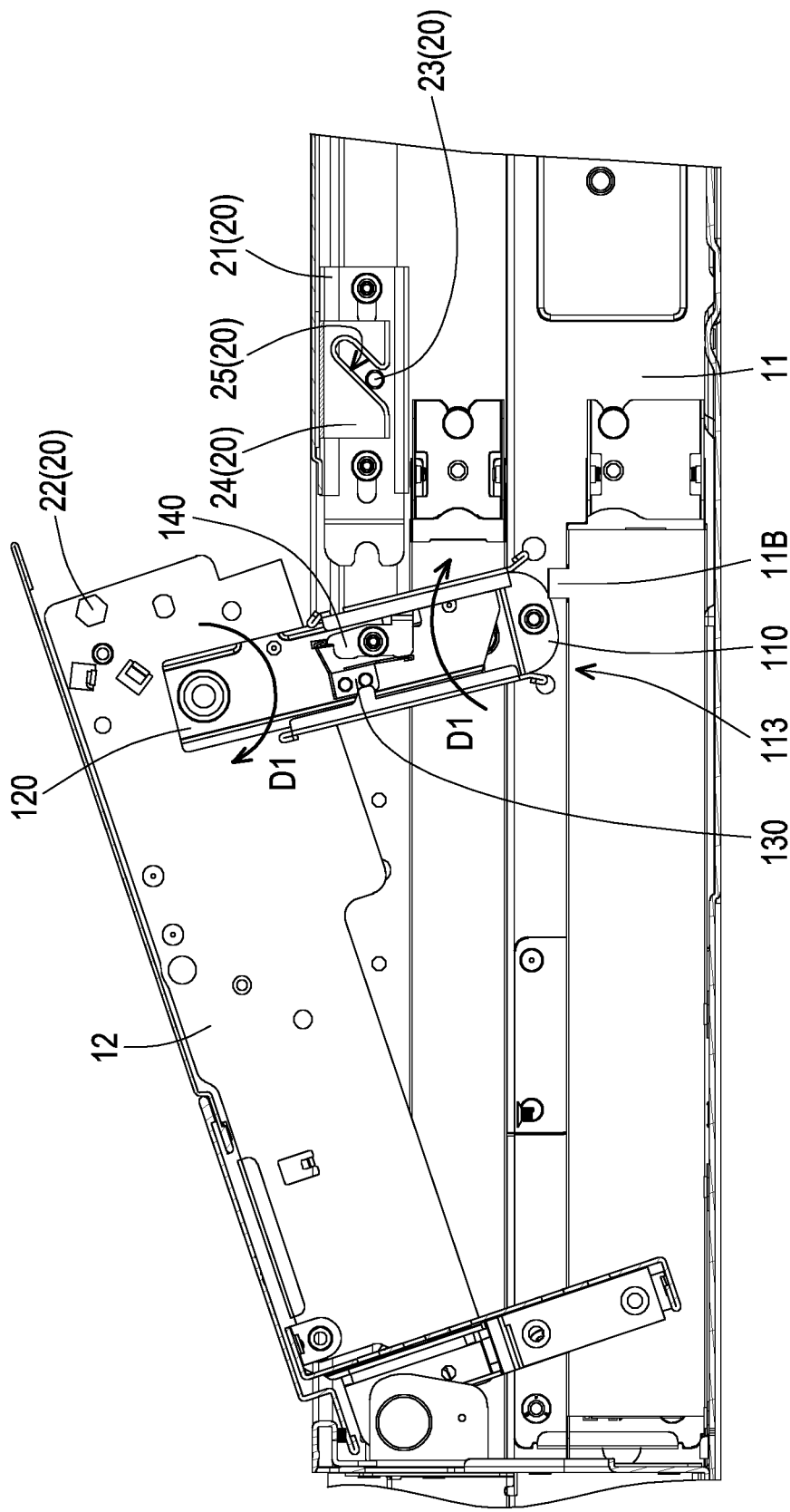
FIG. 4A is a side view of the frame body of FIG. 1 between a third state and a second state relative to the casing.

FIG. 4A is a side view of the frame body of FIG. 1A and FIG. 1B between a third state and a second state relative to the casing. FIG. 4B is a partial enlarged view of the hook member of FIG. 4A. It should be noted that some members of FIG. 4A and FIG. 4B are drawn in perspective for the object of clarity and ease of illustration.

Please refer to FIG. 4A and FIG. 4B, the outer rail 110 of the present embodiment is provided with a restraining section 112 (FIG. 4B), an end 113 of the outer rail 110 is provided with a guide slope 114 (FIG. 4B), and the guide slope 114 is connected to the restraining section 112. During the movement of the frame body 12 from the first state S1 to the second state S2, the inner rail 120 is pivoted relative to the frame body 12 along a first rotation direction D1, the outer rail 110 is pivoted relative to the casing 11 along the first rotation direction D1, and the second hook portion 142 of the hook member 140 is used to be in contact with the guide slope 114 during the sliding process of the inner rail 120 relative to the outer rail 110.

The first rotation direction D1 of the present embodiment is the clockwise direction in FIG. 4A, but the invention is not limited thereto. Moreover, the length of the outer rail 110 of the present embodiment is only up to the position of the end 113, however in other embodiments of the invention, the length of the outer rail 110 may exceed the position of the end 113 without affecting the sliding of the inner rail 120 and the outer rail 110, and the invention does not limit the length of the outer rail 110.

In the present embodiment, the second hook portion 142 of the hook member 140 is used to make the hook member 140 rotate along the first rotation direction D1 with a first rotating direction R1, and then enter the restraining section 112 of the outer rail 110 and be restrained in the restraining section 112 of the outer rail 110 by being guided by the guide slope 114. When the inner rail 120 is slid relative to the outer rail 110, the hook member 140 is used to be restrained in the outer rail 110 by the restraining section 112. The hook member 140 is used to resist the elastic force of the first elastic portion 131 and the second elastic portion 132 to elastically deform the first elastic portion 131 and the second elastic portion 132. The first elastic portion 131 is abutted against the second side edge 141B of the hook member 140 as shown in FIG. 4B, and the hook member 140 is not stopped by the first elastic portion 131 at this time.

Figure 5A:
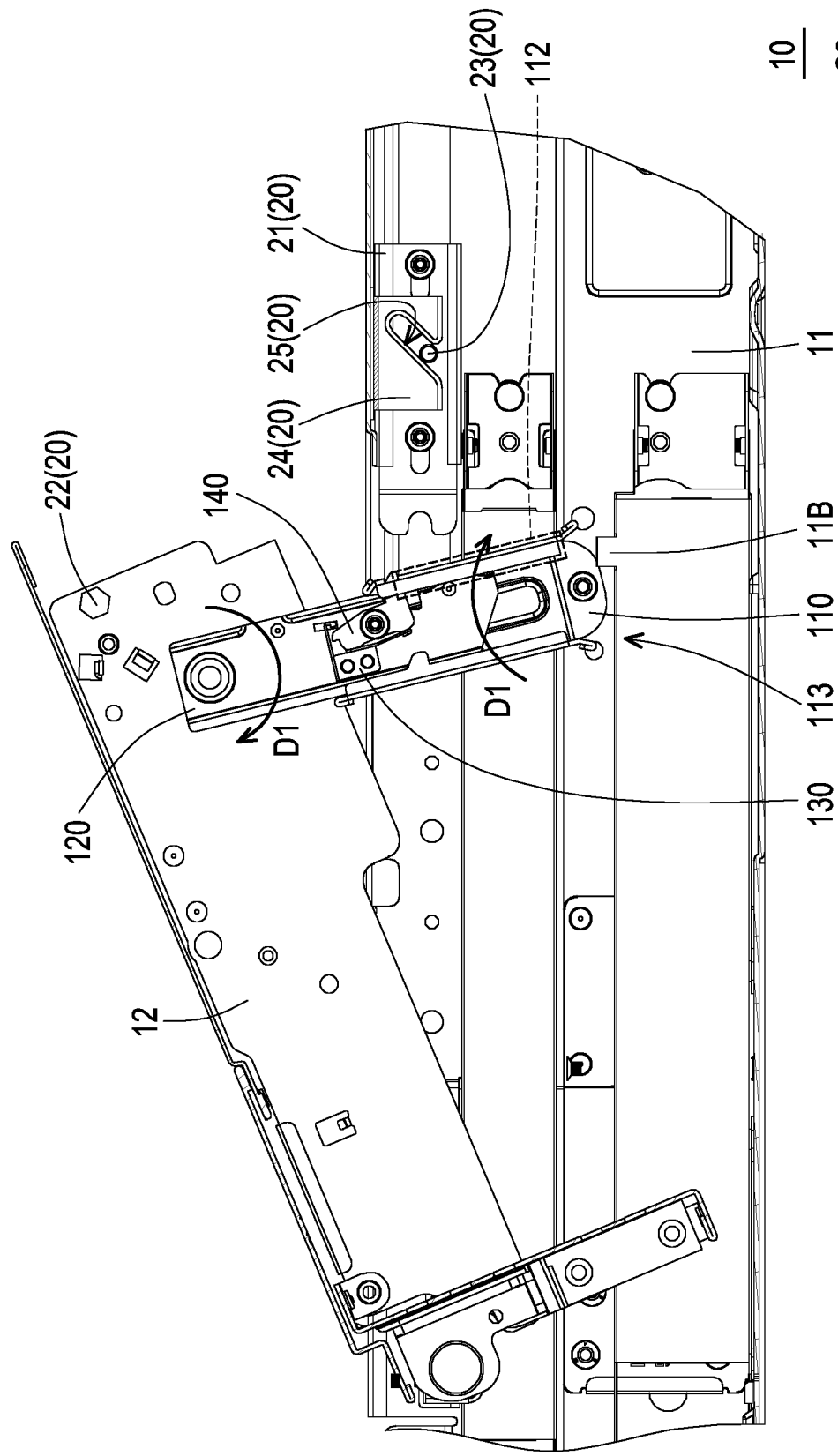
FIG. 5A is a side view of some members of the electronic equipment of FIG. 1B.
Figure 5B:
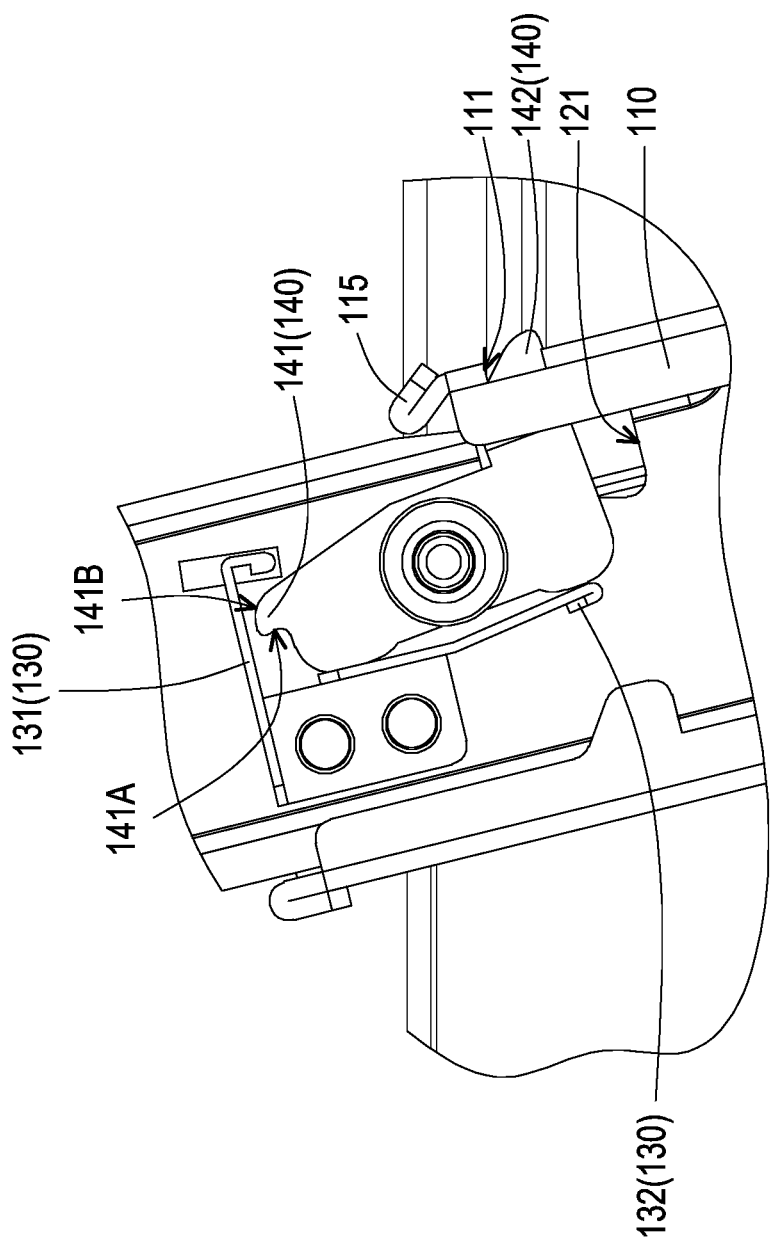
FIG. 5B is a partial enlarged view of the hook member of FIG. 5A.

FIG. 5A is a partial member side view of the electronic equipment of FIG. 1B. FIG. 5B is a partial enlarged view of the hook member of FIG. 5A. It should be noted that some members of FIG. 5A and FIG. 5B are drawn in perspective for the object of clarity and ease of illustration.

Referring to FIG. 1B, FIG. 5A, and FIG. 5B, when the hook member 140 of the present embodiment is located at a second position P2 by sliding the inner rail 120 relative to the outer rail 110, the second opening portion 121 is opposite to the first opening portion 111, and because the hook member 140 is not stopped by the first elastic portion 131, the second hook portion 142 of the hook member 140 is pushed by the second elastic portion 132 of the elastic member 130 to pass through the second opening portion 121 and the first opening portion 111 at the same time. The inner rail 120 is thereby fixed relative to the outer rail 110, so that the hook member 140 is located at the second position P2. The restraining section 112 is located between the first opening portion 111 and the guide slope 114 at the end of the outer rail 110. When the inner rail 120 is slid relative to the outer rail 110, the hook member 140 is located at the second position P2, and the frame body 12 is also in the second state S2 as shown in FIG. 1B due to pivoting relative to the casing 11 at the same time.

Figure 6A:
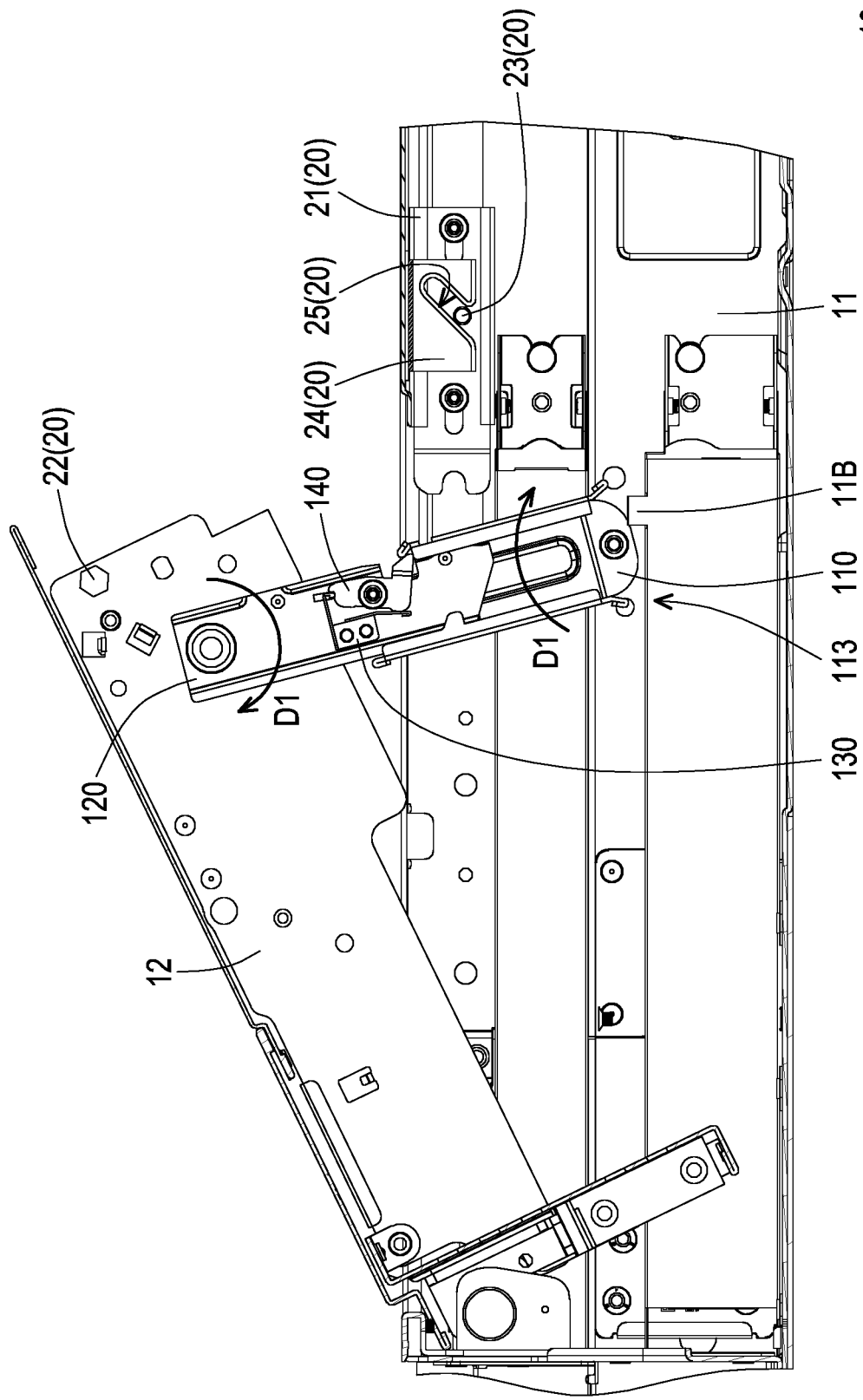
FIG. 6A is a side view of the hook member of FIG. 1 being stopped by the elastic assembly after being guided by the guide portion.
Figure 6B:
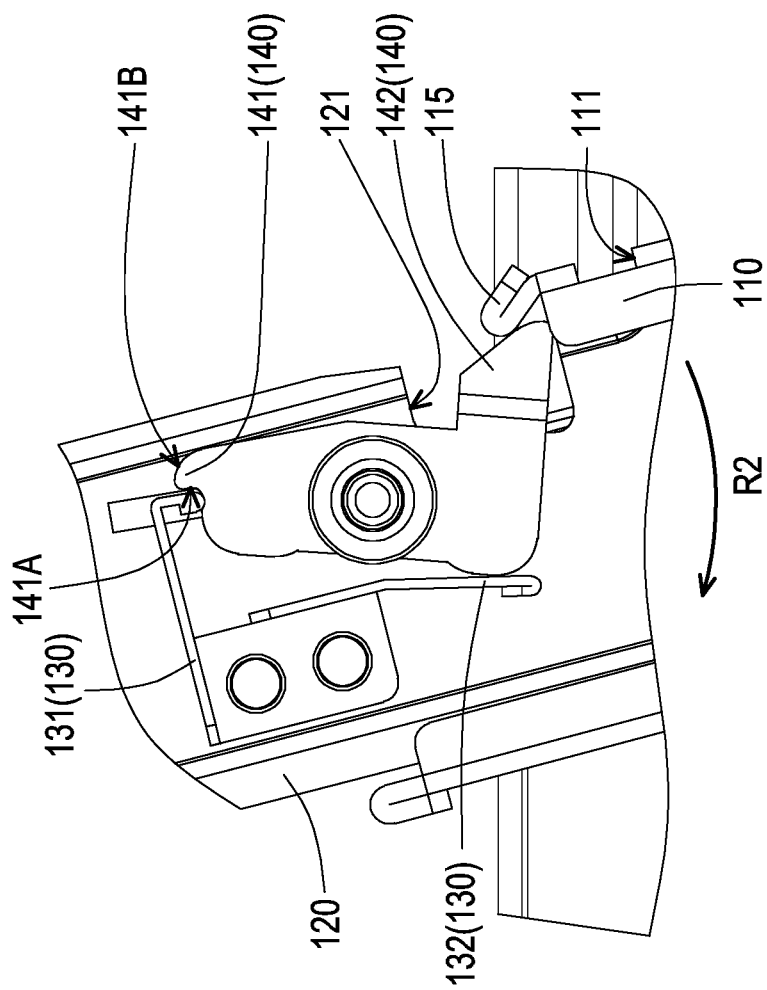
FIG. 6B is a partial enlarged view of the hook member of FIG. 6A.

FIG. 6A is a side view of the hook member of FIG. 1A and FIG. 1B being stopped by the elastic assembly after being guided by the guide portion. FIG. 6B is a partial enlarged view of the hook member of FIG. 6A. It should be noted that some members of FIG. 6A and FIG. 6B are drawn in perspective for the object of clarity and ease of illustration.

Referring to FIG. 6A and FIG. 6B, the outer rail 110 of the present embodiment is provided with a guide portion 115 (FIG. 6B), and the first opening portion 111 is located between the restraining section 112 and the guide portion 115. The hook member 140 is used to be guided by the guide portion 115 along the first rotation direction D1 with a second rotating direction R2 greater than the first rotating direction R1. Therefore, the first elastic portion 131 may pass over the second side edge 141B of the first hook portion 141 after the hook member 140 is rotated and be stopped at the first side edge 141A of the first hook portion 141, and the second elastic portion 132 is simultaneously pressed by the hook member 140 to elastically deform.

In the present embodiment, when the hook member 140 is stopped by the first elastic portion 131, the second hook portion 142 of the hook member 140 may be prevented from passing through the second opening portion 121, so that the second hook portion 142 of the hook member 140 is folded in the first opening portion 111 of the outer rail 110. In this way, the user may drive the inner rail 120 to be slid relative to the outer rail 110 again because the second hook portion 142 is retracted into the outer rail 110. Therefore, the frame body 12 may be pivoted relative to the casing 11 to the first state S1 again, which is beneficial for the user to readily re-close the frame body 12 to the casing 11.

Figure 7:
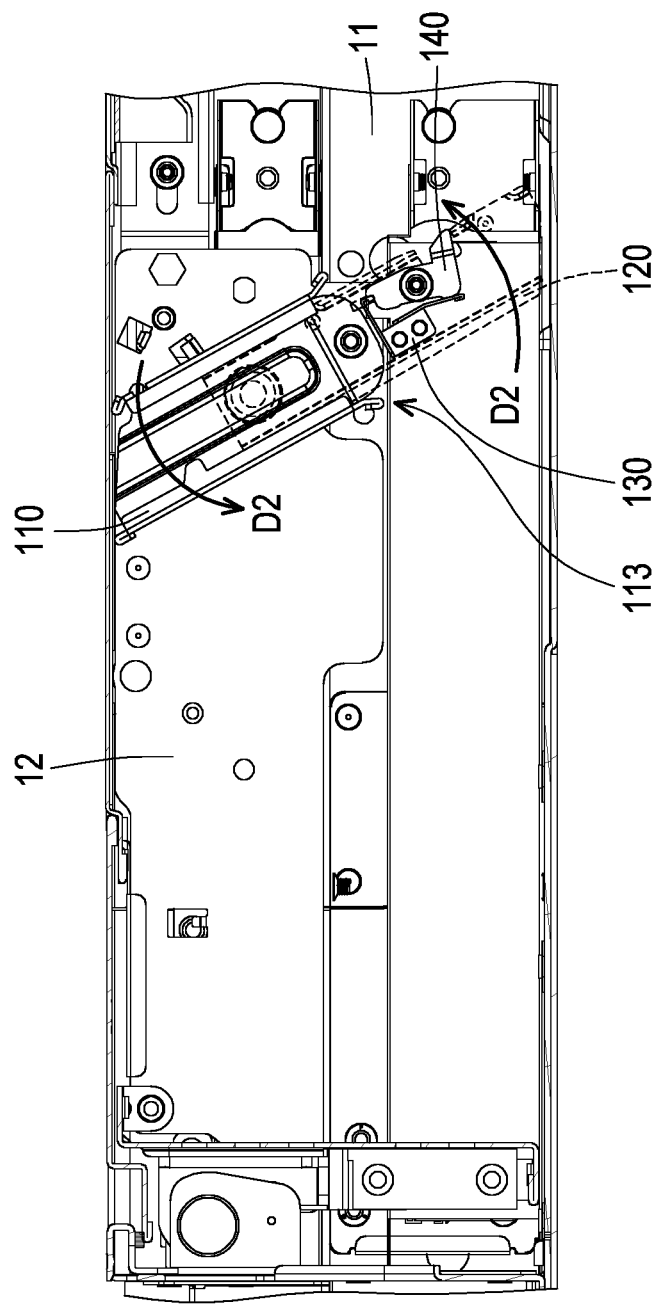
FIG. 7 is a side view of the frame body of FIG. 6A pivoted relative to the casing to a first state.

FIG. 7 is a side view of the frame body of FIG. 6A pivoted relative to the casing to a first state. It should be noted that some members of FIG. 7 are drawn in perspective for the object of clarity and ease of illustration. Referring to FIG. 6A to FIG. 7, when the second hook portion 142 of the present embodiment is retracted into the first opening portion 111 of the outer rail 110 as shown in FIG. 6A and FIG. 6B, the hook member 140 may be re-moved to the first position P1 as shown in FIG. 7 via the unobstructed sliding between the inner rail 120 and the outer rail 110, and the frame body 12 may be moved relative to the casing 11 to the first state S1 via the rotation of the inner rail 120 relative to the frame body 12 along a second rotation direction D2 and the rotation of the outer rail 110 relative to the casing 11 along the second rotation direction D2. The second rotation direction D2 of the present embodiment is the counterclockwise direction in FIG. 7, but the invention is not limited thereto.

Figure 8A:
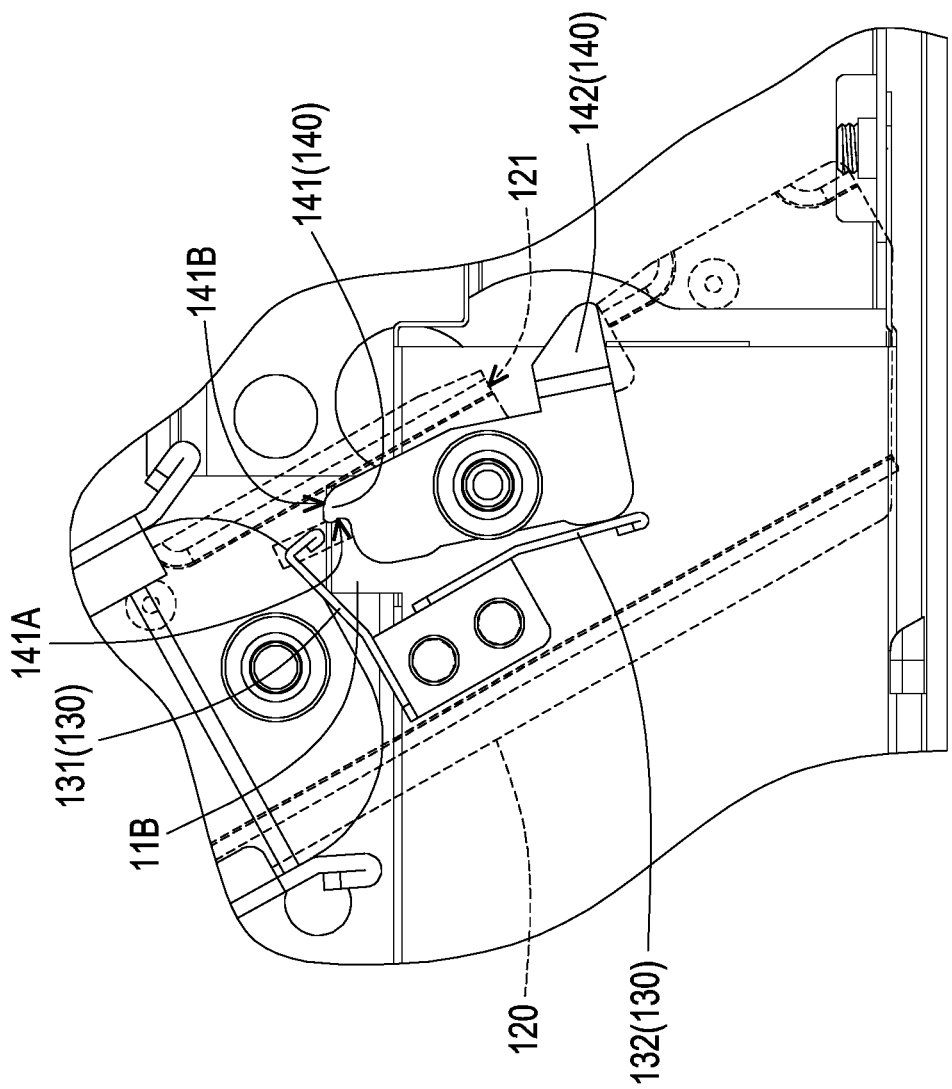
FIG. 8A to FIG. 8C are flowcharts of operations of the hook member of FIG. 7 after the elastic assembly is pushed by the abutting member.
Figure 8B:
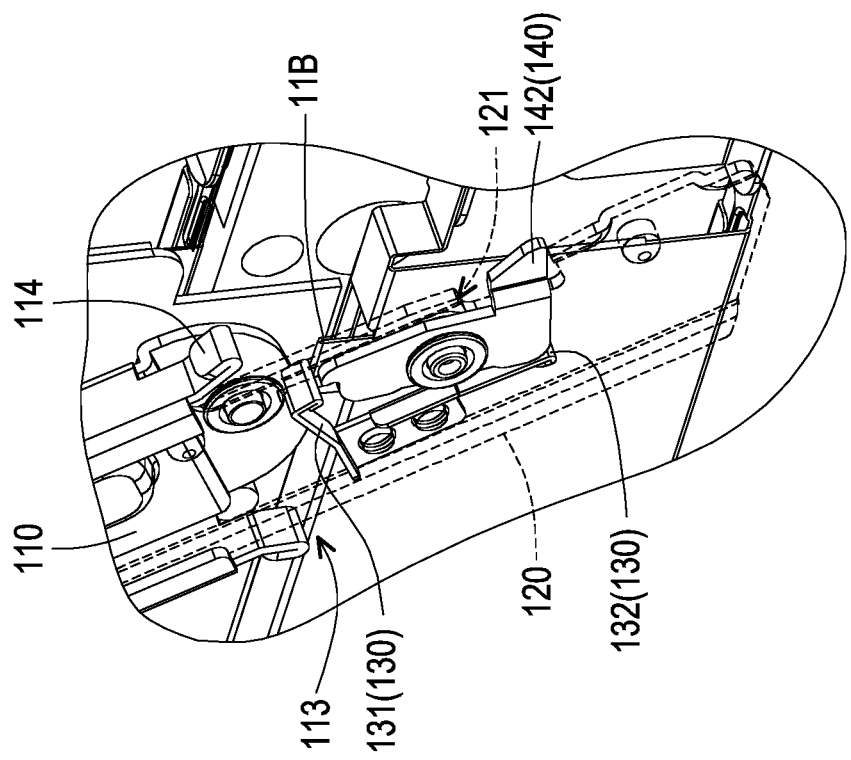
Figure 8C:
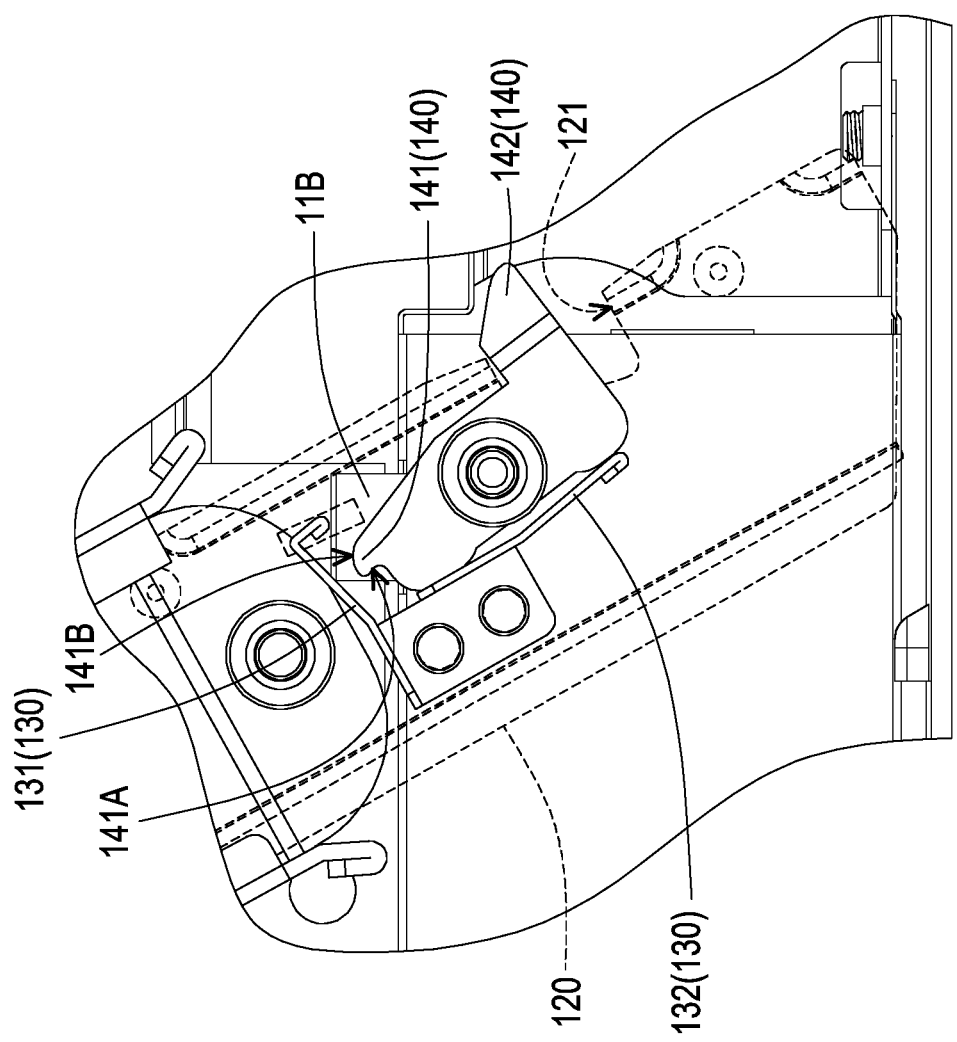

FIG. 8A to FIG. 8C are flowcharts of operations of the hook member of FIG. 7 after the elastic assembly is pushed by the abutting member. Please refer to FIG. 6B and FIG. 8A to FIG. 8C, in detail, the casing 11 of the present embodiment includes an abutting member 11B. Before the hook member 140 is positioned at the first position P1 by sliding the inner rail 120 relative to the outer rail 110, the first hook portion 141 of the hook member 140 is stopped by the first elastic portion 131 as shown in FIG. 6B, the second hook portion 142 is folded in the second opening portion 121, and the second elastic portion 132 is elastically deformed by being squeezed by the hook member 140.

In the present embodiment, when the hook member 140 is folded in the casing 11 by sliding the inner rail 120 relative to the outer rail 110 to the first position P1 and the frame body 12 is in the first state S1, as shown in FIG. 8A, the first elastic portion 131 is used to be pushed by the abutting member 11B to be separated from the first side edge 141A of the first hook portion 141 and release the first hook portion 141. The second elastic portion 132 elastically deformed by being squeezed by the hook member 140 is thus released, so that the second hook portion 142 of the hook member 140 is pushed by the elastic force of the second elastic portion 132 to pass through the second opening portion 121 as shown in FIG. 8C. Accordingly, the second hook portion 142 of the hook member 140 may pass through the second opening portion 121 and the first opening portion 111 when the inner rail 120 is slid relative to the outer rail 110 to the second position P2 again so that the frame body 12 is folded in the casing 11. Therefore, the inner rail 120 may be fixed at the second position P2 relative to the outer rail 110, and the frame body 12 may also be positioned in the second state S2 relative to the casing 11 again.

In the electronic equipment of the prior art, the user needs to turn the handle themselves to position the frame body of the electronic equipment in a different state with respect to the casing, and then disassemble and replace the hard disk carried on the frame body. In contrast, the frame body 12 of the invention may be positioned in the different first state S1 and second state S2 with respect to the casing 11 via the inner rail 120 and the outer rail 110 that may be slidably mounted and positioned relative to each other. When the frame body 12 is fixed relative to the casing 11 in the second state S2 in which the two are unfolded relative to each other, the user may readily and quickly disassemble or mount the hard disk (not shown) in the receiving slot 12B (FIG. 1B) of the frame body 12, and the electronic equipment 10 has the effect of quick disassembly and replacement of the hard disk. In addition, the electronic equipment 10 of the invention also has a pleasing appearance because the handle design is omitted.

Figure 9A:
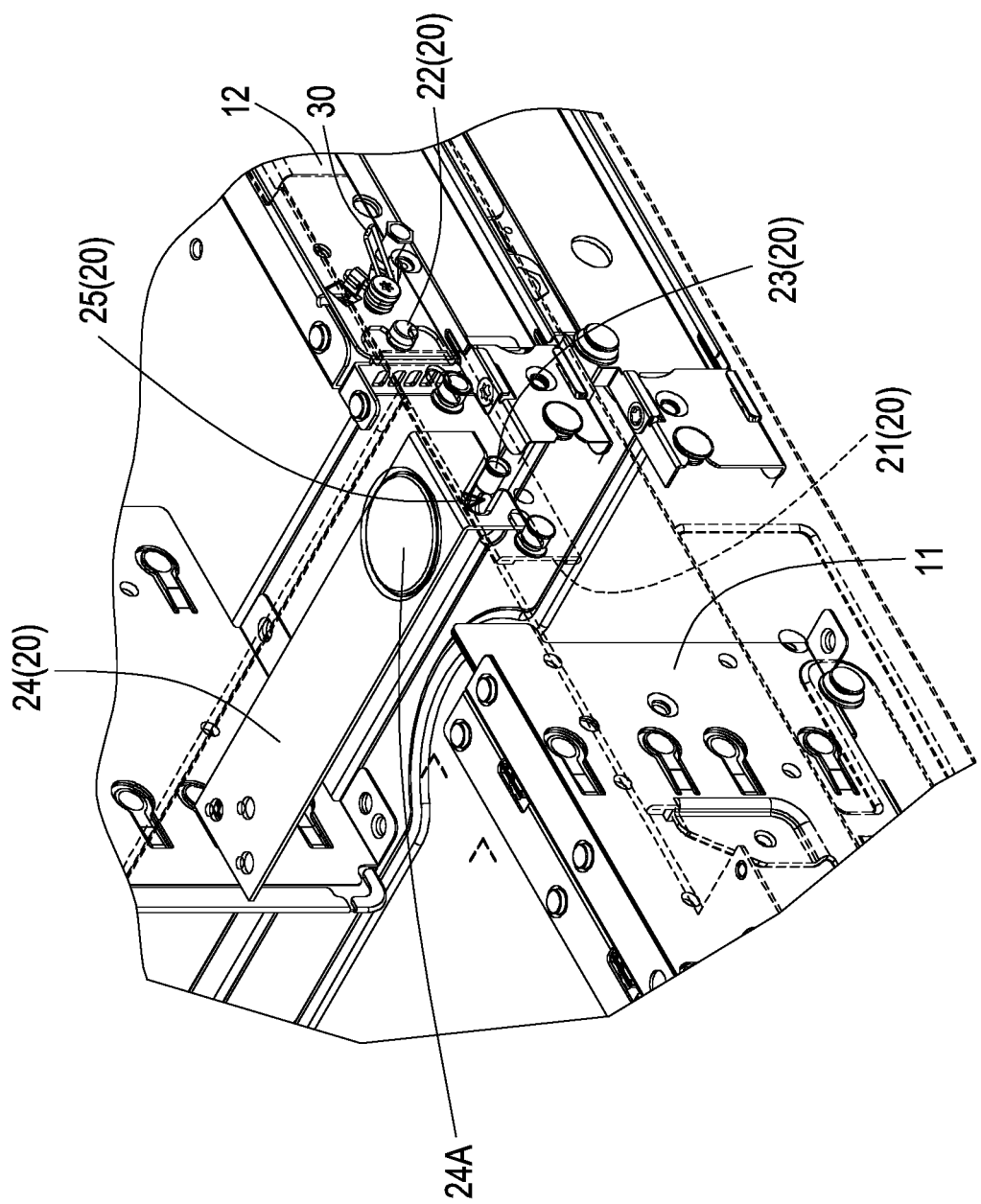
FIG. 9A is a partial enlarged view of the positioning assembly of FIG. 1.
Figure 9B:
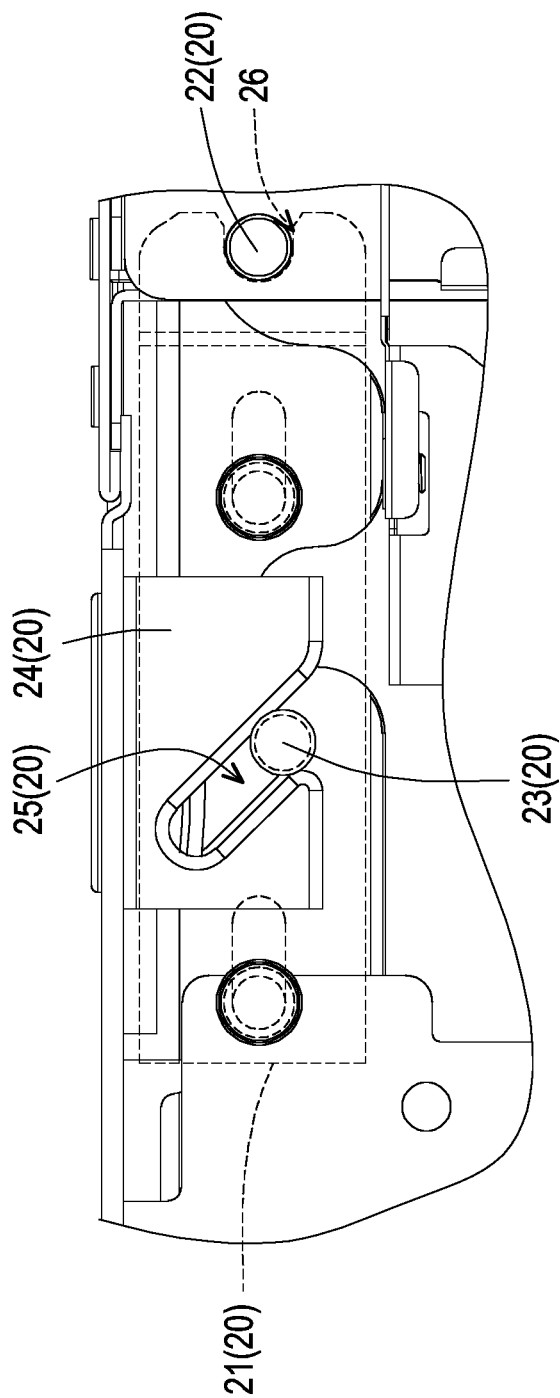
FIG. 9B is a side view of the positioning assembly of FIG. 9A.

FIG. 9A is a partial enlarged view of the positioning assembly of FIG. 1A and FIG. 1B. FIG. 9B is a side view of the positioning assembly of FIG. 9A. It should be noted that some members of FIG. 9A and FIG. 9B are drawn in perspective for the object of clarity and ease of illustration.

Please refer to FIG. 9A and FIG. 9B, the electronic equipment 10 of the present embodiment includes a positioning assembly 20 and an elastic member 30. When the frame body 12 is folded in the casing 11, the positioning assembly 20 is used to position the frame body 12 in the first state S1, and the positioning assembly 20 has a button 24A. The user lets the positioning assembly 20 release the frame body 12 by pressing the button 24A, then the elastic member 30 drives the frame body 12 to bounce relative to the casing 11 to be unfolded via the elastic force thereof. The user then may then pivot the frame body 12 relative to the casing 11 to the second state S2 as described above.

In detail, the positioning assembly 20 of the present embodiment includes a first link member 21, a positioning pin 22, a protruding column 23, a second link member 24, and a chute 25. The first link member 21 is movably disposed on the casing 11, the positioning pin 22 is disposed on the frame body 12, the protruding column 23 is disposed on the first link member 21, and the chute 25 is obliquely disposed on the second link member 24. The first link member 21 is provided with a positioning slot 26 (FIG. 9B), and the positioning slot 26 is used to accommodate the positioning pin 22 to position the frame body 12 in the first state S1.

Figure 10A:
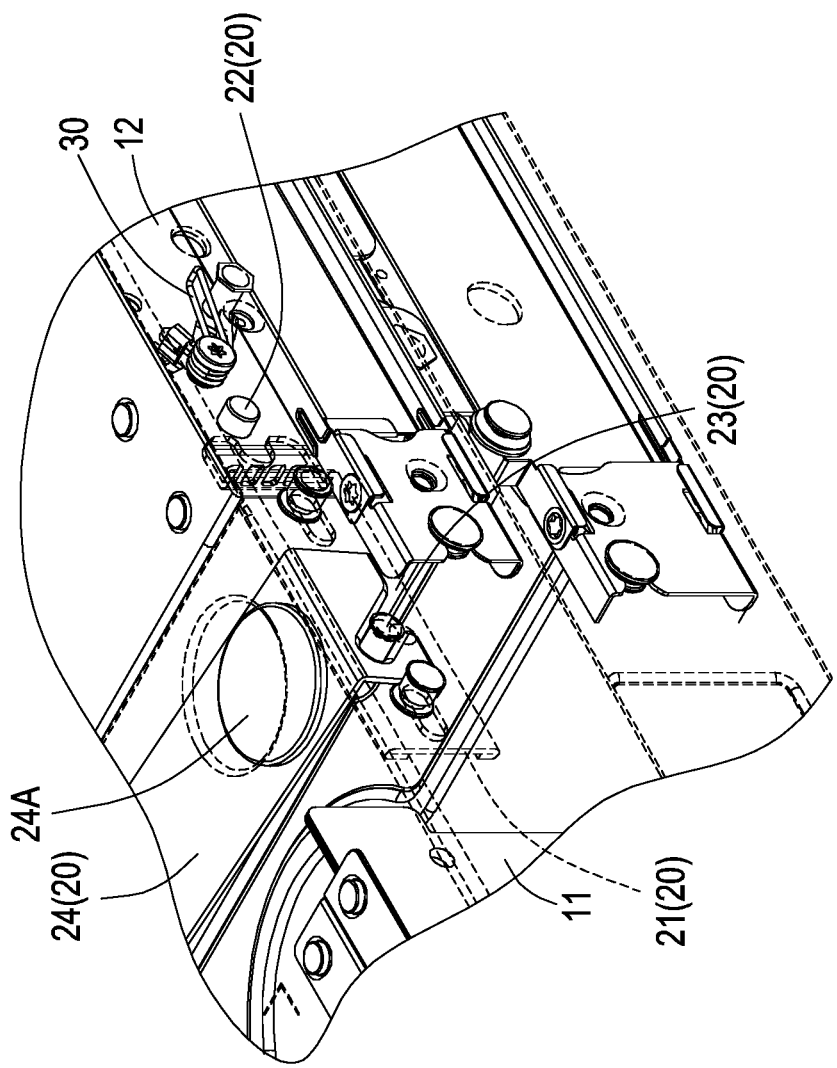
FIG. 10A is a partial enlarged view of the second link member of FIG. 9A when pressed down.
Figure 10B:
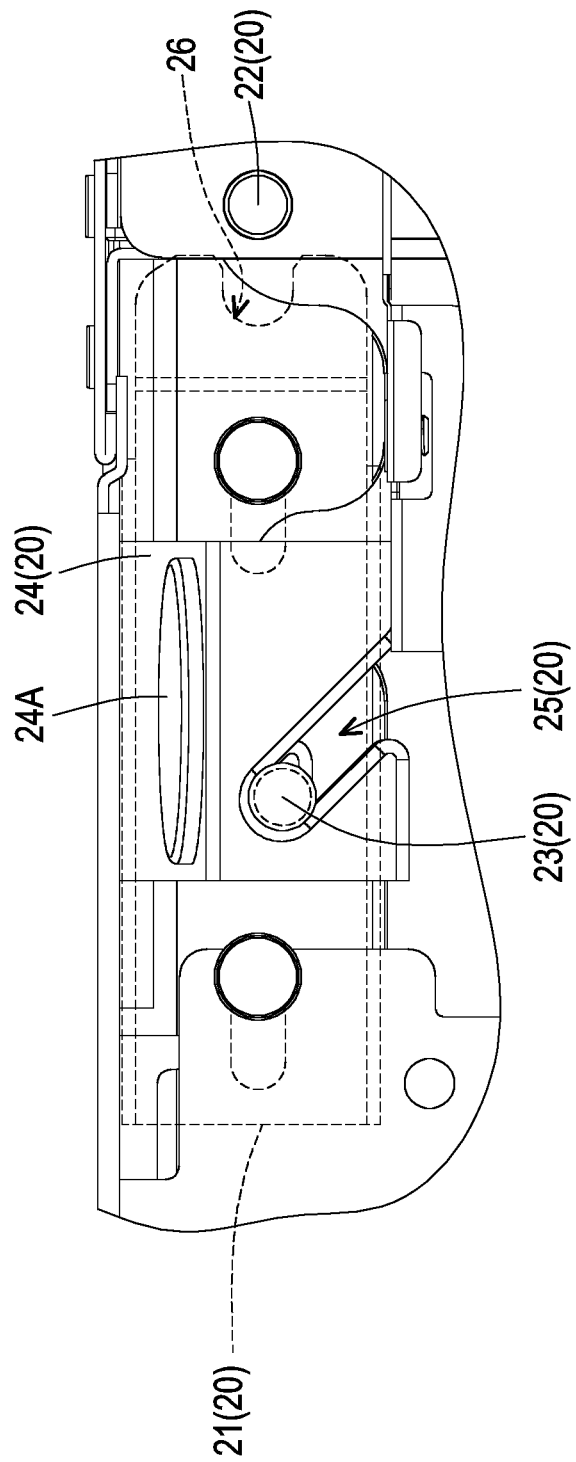
FIG. 10B is a side view of the positioning assembly of FIG. 10A.

FIG. 10A is a partial enlarged three-dimensional view of the second link member of FIG. 9A when pressed down. FIG. 10B is a side view of the positioning assembly of FIG. 10A. It should be noted that some members of FIG. 10A and FIG. 10B are drawn in perspective for the object of clarity and ease of illustration.

Please refer to FIG. 2B, FIG. 10A, and FIG. 10B, the button 24A of the present embodiment is located on the second link member 24. The button 24A is used to be pressed down to drive the protruding column 23 of the first link member 21 to be slid along the chute 25 of the second link member 24 so as to drive the first link member 21 to be separated from the positioning pin 22. Accordingly, the frame body 12 is released from the first state S1 relative to the casing 11, and pivoted between the first state S1 and the second state S2 with the pivot portion 12A (FIG. 2B) as the axis to be unfolded or folded in the casing 11.

Figure 11A:
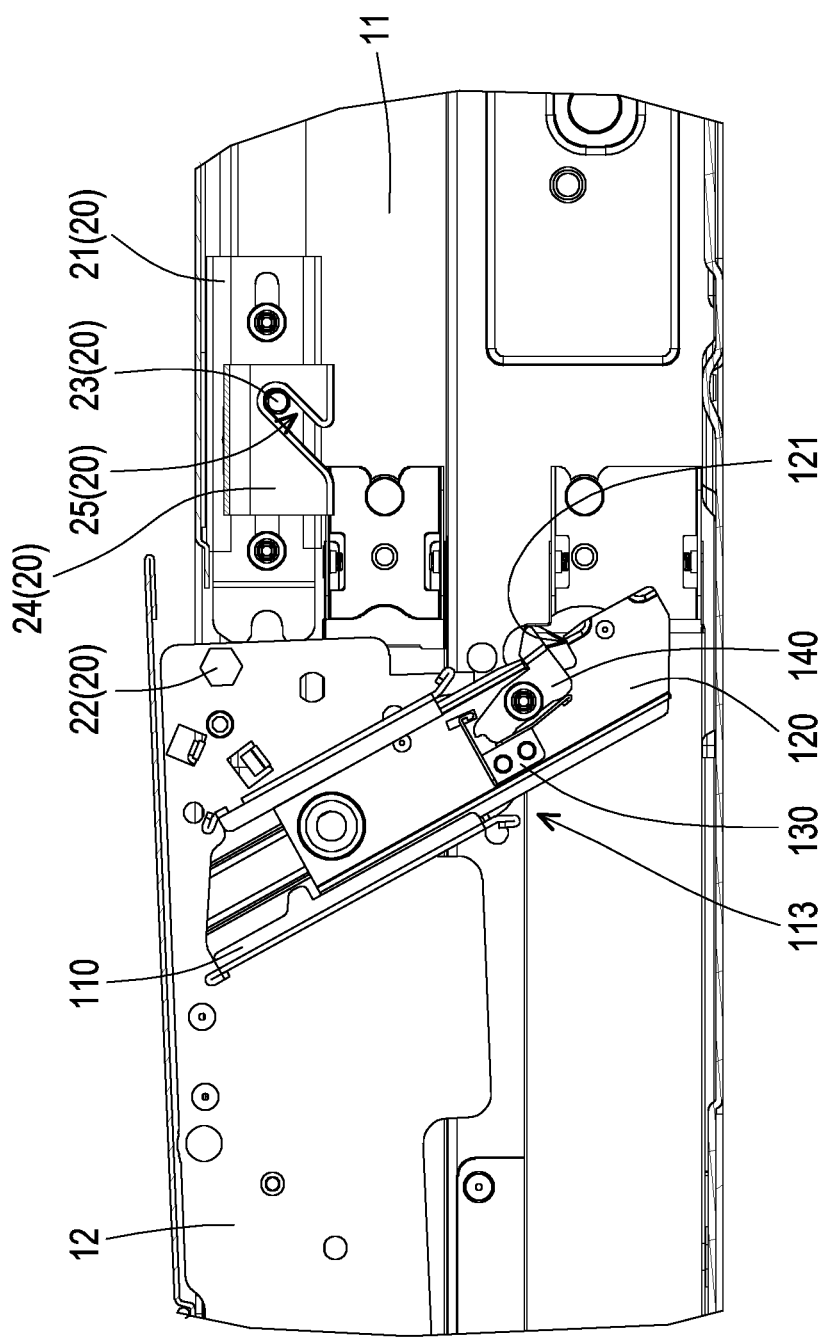
FIG. 11A is a side view of the frame body of FIG. 1 in a third state relative to the casing.
Figure 11B:
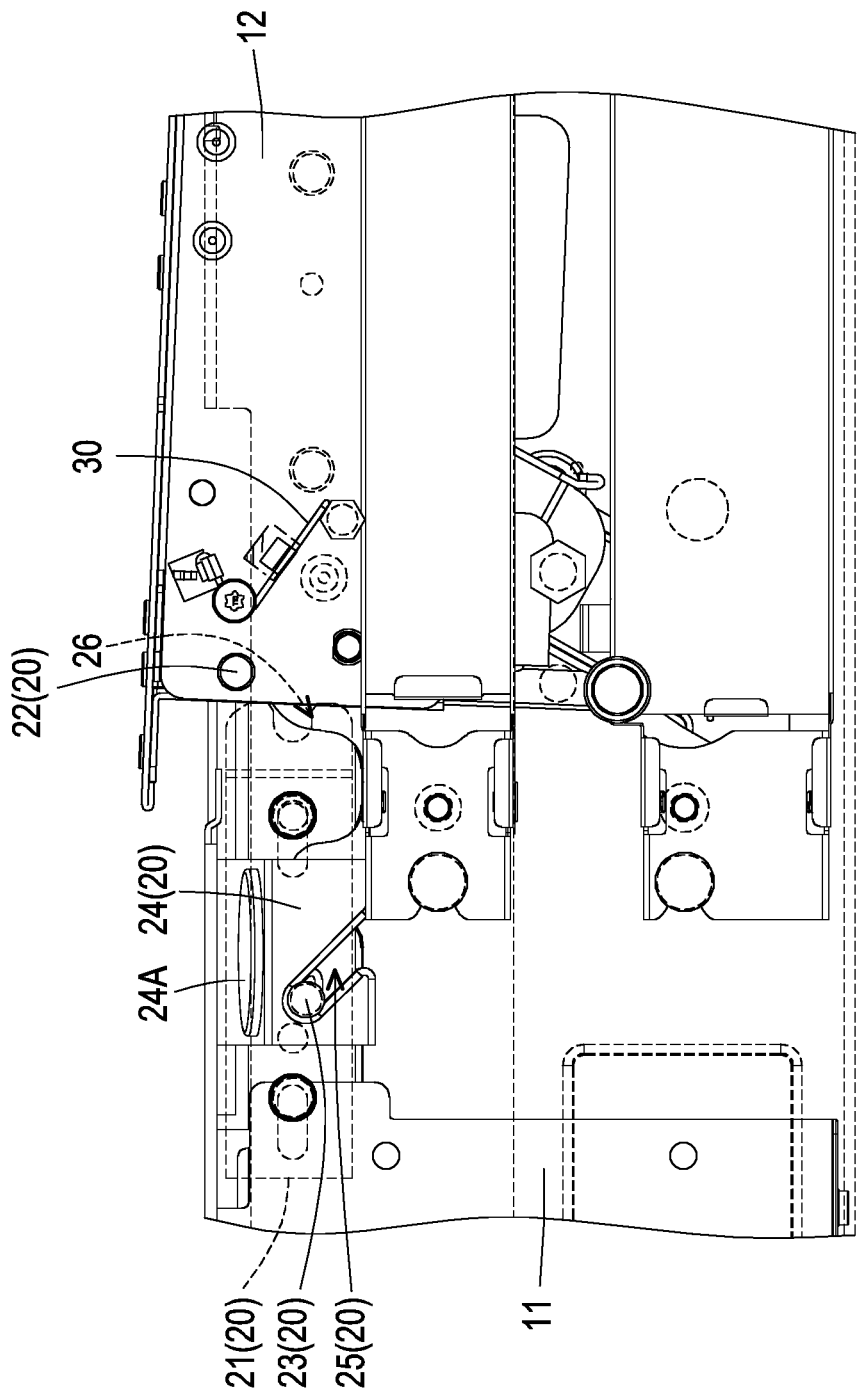
FIG. 11B is a side view of another side of the electronic equipment of FIG. 11A.

FIG. 11A is a side view of the frame body of FIG. 1A and FIG. 1B in a third state relative to the casing. FIG. 11B is a side view of another side of the electronic equipment of FIG. 11A. It should be noted that some members of FIG. 11A and FIG. 11B are drawn in perspective for the object of clarity and ease of illustration.

Referring to FIGS. 11A and 11B, the elastic member 30 (FIG. 11B) of the present embodiment is disposed between the frame body 12 and the casing 11 and located on the frame body 12. When the first link 21 is separated from the positioning pin 22 of the frame body 12, and the frame body 12 is released from the first state S1 relative to the casing 11, the frame body 12 is used to act on the casing 11 via the elastic force of the elastic member 30 to drive the frame body 12 to be unfolded relative to the casing 11 from the first state S1 to a third state S3 as shown in FIG. 11A and FIG. 11B. The third state S3 is between the first state S1 and the second state S2, and the user may manually rotate the frame body 12 when the frame body 12 is in the third state S3 to pivot the frame body 12 relative to the casing 11 to the second state S2 as described above.

Based on the above, in the rails assembly and the electronic equipment of the invention, the inner rail and the outer rail are pivotally connected to the frame body and the casing, respectively, and the inner rail is slidably disposed on the outer rail. Thereby, the inner rail and the outer rail have sufficient freedom of movement to drive the frame body to be operated in the different first state and second state relative to the casing. Moreover, the inner rail and the outer rail of the invention are respectively provided with the second opening portion and the first opening portion for the hook member to pass through, so that the hook member may be smoothly moved between the first position corresponding to the first state and the second position corresponding to the second state and smoothly positioned at the second position as the inner rail slides relative to the outer rail. Accordingly, compared with the electronic equipment of the prior art for which the frame body needs to be positioned in different states by operating the handle, the electronic equipment of the invention may achieve this object without a handle via the above configuration with simple operation, so that the hard disk on the frame body may be readily disassembled and replaced, and the overall device is more aesthetically pleasing.

What is claimed is:

1. An electronic equipment, comprising:
   a casing;
   a frame body detachably mounted on the casing; and
   a rails assembly comprising an outer rail and an inner rail, wherein the outer rail is pivotally connected to the casing, and the inner rail is pivotally connected to the frame body and slidably disposed on the outer rail,
   wherein the frame body is selectively folded in the casing by sliding the inner rail relative to the outer rail to make the inner rail pivot relative to the frame body and the outer rail pivot relative to the casing,
   wherein the outer rail is provided with a first opening portion, the inner rail is provided with a second opening portion, the rails assembly comprises an elastic assembly and a hook member, the elastic assembly is disposed on the inner rail, and the hook member is pivotally connected to the inner rail and opposite to the second opening portion,
   wherein when the frame body is folded in the casing, the hook member is pushed by the elastic assembly to pass through the second opening portion; when the frame body is unfolded on the casing, the second opening portion is opposite to the first opening portion, and the hook member is pushed by the elastic assembly to pass through the second opening portion and the first opening portion.

2. The electronic equipment of claim 1, comprising a positioning assembly, when the frame body is folded in the casing, the frame body is positioned by the positioning assembly.

3. The electronic equipment of claim 2, wherein the positioning assembly comprises a first link member and a positioning pin, the first link member is movably disposed on the casing and provided with a positioning groove, the positioning pin is disposed on the frame body, and the positioning pin is accommodated in the positioning groove to position the frame body.

4. The electronic equipment of claim 3, wherein the positioning assembly comprises a protruding column, a second link member, and a chute, the protruding column is disposed on the first link member, the chute is obliquely disposed on the second link member, and the protruding column is driven to be slid along the chute by the second link member, and the first link member is driven to be separated from the positioning pin.

5. The electronic equipment of claim 1, comprising an elastic member, wherein the elastic member is disposed between the frame body and the casing, and the frame body is unfolded via an elastic force of the elastic member selectively.

6. The electronic equipment of claim 1, wherein the frame body is provided with a pivot portion, the casing is provided with a pivot hole, the pivot portion is detachably pivoted to the pivot hole, and the frame body is pivoted with the pivot portion as an axis to be unfolded or folded in the casing selectively.

7. The electronic equipment of claim 1, wherein the elastic assembly comprises a first elastic portion and a second elastic portion, the casing comprises an abutting member, when the first elastic portion is pushed by the abutting member to be separated from the hook member to prevent the hook member from passing through the second opening portion, the hook member is pushed by the second elastic portion to pass through the second opening portion.

8. A rails assembly, comprising: an outer rail provided with a first opening portion; an inner rail provided with a second opening portion and slidably mounted on the outer rail; an elastic assembly disposed on the inner rail; and a hook member pivotally connected to the inner rail and opposite to the second opening portion; wherein when the hook member is located at a first position by sliding the inner rail closer to the outer rail, the hook member is pushed by the elastic assembly to pass through the second opening portion; when the hook member is located at a second position by sliding the inner rail away from the outer rail, the second opening portion is opposite to the first opening portion and the hook member is pushed by the elastic assembly to pass through the second opening portion and the first opening portion.

9. The rails assembly of claim 8, wherein the elastic assembly comprises a first elastic portion and a second elastic portion, when the first elastic portion releases the hook member, the hook member is pushed by the second elastic portion to pass through the second opening portion.

10. The rails assembly of claim 9, wherein an end of the outer rail is provided with a guide slope, and the hook member is guided by the guide slope to enter the outer rail.

11. The rails assembly of claim 10, wherein the outer rail is provided with a restraining section, the restraining section is located between the guide slope and the first opening portion, and when the inner rail is slid relative to the outer rail, the hook member is restrained in the outer rail by the restraining section.

12. The rails assembly of claim 9, wherein the hook member is provided with a first hook portion and a second hook portion, when the first elastic portion releases the first hook portion, the second hook portion passes through the second opening portion via an elastic force of the second elastic portion.

13. The rails assembly of claim 11, wherein the outer rail is provided with a guide portion, the first opening portion is located between the restraining section and the guide portion, when the hook member guided by the guide portion, the hook portion is stopped by the first elastic portion, and prevented from passing through the second opening portion.

14. The rails assembly of claim 10, wherein the outer rail is provided with a restraining section and a guide portion, the restraining section is located between an end of the outer rail and the first opening portion, the first opening portion is located between the restraining section and the guide portion, the hook member is restrained in the outer rail by the restraining section with a first rotating direction, the hook member is guided by the guide portion and stopped by the first elastic portion with a second rotating direction, the second rotating direction is greater than the first rotating direction.

* * * * *